(12) United States Patent
Mullapudi et al.

(10) Patent No.: US 9,932,668 B2
(45) Date of Patent: Apr. 3, 2018

(54) PHYSICAL VAPOR DEPOSITION SYSTEM USING BACKSIDE GAS COOLING OF WORKPIECES

(71) Applicant: Tango Systems, Inc., San Jose, CA (US)

(72) Inventors: Ravi Mullapudi, San Jose, CA (US); Harish Varma Penmethsa, Sunnyvale, CA (US); Harshal T. Vasa, Santa Clara, CA (US); Srikanth Dasaradhi, San Jose, CA (US); Lee LeBlanc, Sunnyvale, CA (US)

(73) Assignee: Tango Systems Inc., San Jose, CA (US)

(*) Notice: Subject to any disclaimer, the term of this patent is extended or adjusted under 35 U.S.C. 154(b) by 217 days.

(21) Appl. No.: 14/923,357

(22) Filed: Oct. 26, 2015

(65) Prior Publication Data
US 2017/0114448 A1  Apr. 27, 2017

(51) Int. Cl.
| | |
|---|---|
| *C23C 14/00* | (2006.01) |
| *C23C 14/35* | (2006.01) |
| *C23C 14/50* | (2006.01) |
| *C23C 14/54* | (2006.01) |
| *H01J 37/34* | (2006.01) |
| *H01J 37/32* | (2006.01) |

(52) U.S. Cl.
CPC .......... *C23C 14/352* (2013.01); *C23C 14/505* (2013.01); *C23C 14/541* (2013.01); *H01J 37/32724* (2013.01); *H01J 37/3405* (2013.01); *H01J 37/3455* (2013.01); *H01J 37/3464* (2013.01); *C23C 14/50* (2013.01); *H01J 37/3411* (2013.01); *H01J 2237/006* (2013.01); *H01J 2237/2001* (2013.01); *H01J 2237/20214* (2013.01)

(58) Field of Classification Search
CPC .............................. H01J 37/3411; C23C 14/50
USPC ............... 165/135; 427/248.1, 282; 438/478; 156/345.32
See application file for complete search history.

(56) References Cited

U.S. PATENT DOCUMENTS

| | | | | |
|---|---|---|---|---|
| 2002/0170673 | A1* | 11/2002 | Tanguay | C23C 14/56 156/345.32 |
| 2006/0246690 | A1* | 11/2006 | Dordi | C25D 17/06 438/478 |
| 2006/0275547 | A1* | 12/2006 | Lee | C23C 14/50 427/248.1 |

(Continued)

*Primary Examiner* — Timon Wanga
(74) *Attorney, Agent, or Firm* — Patent Law Group LLP; Brand D. Ogonowsky

(57) ABSTRACT

A circular PVD chamber has a plurality of sputtering targets mounted on a top wall of the chamber. A pallet in the chamber is coupled to a motor for rotating the pallet about its center axis. The pallet has a diameter less than the diameter of the circular chamber. The pallet is also shiftable in an XY direction to move the center of the pallet beneath any of the targets so all areas of a workpiece supported by the pallet can be positioned directly below any one of the targets. A scanning magnet is in back of each target and is moved, via a programmed controller, to only be above portions of the workpiece so that no sputtered material is wasted. For depositing a material onto small workpieces, a cooling backside gas volume is created between the pallet and the underside of sticky tape supporting the workpieces.

9 Claims, 12 Drawing Sheets

(56) References Cited

U.S. PATENT DOCUMENTS

2011/0293835 A1* 12/2011 Lavi ...................... C23C 14/044
  427/282
2013/0264035 A1* 10/2013 Goel ....................... C23C 14/50
  165/135

* cited by examiner

PHYSICAL VAPOR DEPOSITION SYSTEM USING BACKSIDE GAS COOLING OF WORKPIECES

FIELD OF THE INVENTION

This invention relates to sputtering systems and, in particular, to methods for controlling the sputtering of materials on the workpieces.

BACKGROUND

Sputtering systems are widely used for depositing materials on workpieces, such as semiconductor wafers, display panels, mechanical parts, etc. Sputtering is sometimes referred to as physical vapor deposition, or PVD. In a sputtering operation, thin films comprising materials such as Al, Au, Cu, and Ta are deposited in a vacuum on the workpieces. It is common to deposit a stack of thin films of different materials, such as to form a tri-layer structure comprising Ti/Cu/Au.

Applicant had previously developed a PVD system having multiple wedge-shaped targets around a top wall of a circular vacuum chamber, where workpieces are mounted on a rotating circular pallet below the targets for being positioned under the different targets. The diameter of the pallet was approximately the same as the inner diameter of the vacuum chamber. The rotating pallet not only creates a more uniform deposition, but allows each workpiece to be positioned under targets of different materials for depositing a stack of different materials on the workpieces. This is described in Applicant's U.S. Pat. No. 7,682,495. However, with such a system, the center of the pallet could not be positioned under any of the targets. This was acceptable when the workpieces, such as silicon wafers, were mounted on the pallet away from the center so as to be fully under a target for sputtering. If the workpiece was a single large rectangular panel that overlaid the center of the rotating pallet, the center portion of the panel could not be positioned under a target by the rotating pallet, resulting in the non-coverage of the middle area by the targets.

Thus, what is needed is a technique for performing a PVD process on a large panel on a rotating pallet in a PVD chamber with multiple targets.

Further, for a large rectangular workpiece on the circular pallet, a portion of the targets must be directly above the corners of the rotating workpiece (where the corners extend near the outer perimeter of the pallet) for sputtering on the corner areas, but the sputtering material is wasted when the workpiece is not directly below the entire target, such as when a flat side of the rectangular workpiece (closer to the center of the pallet) is under only a portion of the target. Also, if multiple wafers are mounted on the pallet with spaces between them, sputtered material is wasted if it lands between the wafers.

Thus, what is also needed is a technique for performing a PVD process on a large panel (or other workpieces) on a rotating pallet in a PVD chamber where sputtering is only from portions of the targets that are directly above the workpiece.

The metal pallet is cooled using a liquid coolant flowing in the pallet. The pallet then cools flat wafers that are directly in contact with the pallet surface. However, for some uses, the workpiece is not in direct contact with the pallet surface and cannot be cooled by the pallet. Such is the case where the PVD system is used for depositing a metal layer over an array of IC packages for EMI shielding or for other applications where the workpiece is not in direct contact with the cooled pallet.

Thus, what is also needed is a technique for cooling workpieces supported by the pallet but are not in direct thermal contact with the pallet.

Other improvements are also described.

SUMMARY

Some examples of uses of the present invention are described below.

In one embodiment, a circular rotating pallet is provided in a circular PVD chamber. The pallet has a diameter significantly smaller than the diameter of the chamber. Multiple wedge-shaped targets are arranged in a circle at the top of the chamber. No target is over the center of the chamber. If a large panel, such as a panel covering a majority of the rotatable pallet, is to be subject to a PVD process, an XY stage shifts the rotatable pallet in any XY direction to cause the middle area of the pallet (and panel) to be directly under any sputtering target so that the entire panel can receive the sputtered material by a combination of the rotation of the pallet and the XY shifting of the pallet. A similar benefit is obtained when any workpiece is positioned near the center or edge of the pallet.

In the event that the panel is rectangular, its corners will extend closer to the walls of the chamber than the sides of the panel. The targets must extend close to the walls of the chamber to overlie the corners of the panel while the sputtering is occurring and when the rotating pallet positions a corner below a target. However, sputtering from the outer edge areas of the target when only the side of the panel is below the target wastes sputtering material. To control the area of sputtering from the target, a magnet behind each target shapes the plasma. The magnet scans in an arc from side to side and also moves along the long axis of the target. The magnet can be controlled to cover the entire back area of the target or any portion of it. Therefore, the magnet is controlled to cover only the areas of the target that are directly above a surface of the workpiece (e.g., the panel). This avoids wasting sputtered material, creates a more uniform deposition, and improves efficiency.

Such a benefit is also realized when there are spaces between workpieces on the pallet, and the sputtered material between the workpieces is to be minimized.

If the workpiece is secured to the pallet so that there is good thermal contact, the workpiece is cooled by cooling the pallet with an internal coolant flow. However, in the situation where an array of packaged dies is supported on a sticky tape and the PVD system is to cover the packages with a metal film for shielding, the packaged dies are not in good thermal contact with the pallet and need to be cooled during the PVD process. For example, the packages may only be rated to withstand 150° C. and the PVD process would raise the temperature to 220° C. without some sort of cooling.

In one embodiment, the packages are mounted on a sticky tape having rectangular holes so that a portion of the bottom surfaces of the packages is exposed through the holes, and the edges of the packages are stuck to the top surface of the tape. The land grid array (LGA) or ball grid array (BGA) portions of the packages extend through the holes in the tape. The thin sticky tape is supported by a high magnetic permeability metal frame, such as a steel frame. If the metal frame is circular, the metal frame and tape supporting the packages are mounted over a circular ridge on the pallet that only contacts the outer periphery of the tape. Magnets on the pallet then draw the metal frame toward the pallet, and the ridge creates a good gas seal between the tape and the ridge to form a backside gas volume behind the tape. Holes in the pallet then allow a cooling backside gas to cool the back of the tape and the packages. In one embodiment, the temperature of the packages is limited to 110° C. due to the backside gas, while the temperature would be 220° C. without the backside gas.

The backside gas cooling technique may also be used for any wafer that is not in direct thermal contact with the cooled pallet, such as any wafer mounted on a sticky tape when supported by the pallet.

The backside gas may even cool the workpiece to below the temperature of the pallet. This is useful to control stress and grain structure.

The above descriptions are only specific examples of the use of the technology, and many other benefits can be achieved by the inventive PVD system depending on the specific application of the PVD system.

BRIEF DESCRIPTION OF THE DRAWINGS

Elements with the same numbers in the various figures are the same.

DETAILED DESCRIPTION

The present assignee has obtained a U.S. Pat. No. 7,479, 210, and has a published application US 2012/0024694, describing a sputtering tool, and the present invention is an improvement over those tools. U.S. Pat. No. 7,479,210 and US 2012/0024694 are incorporated herein by reference. Accordingly, only aspects of the improved tool that are relevant to the present invention are described herein in detail. Other features of the tool may be obtained by reviewing the assignee's above-identified publications.

Figure 1:
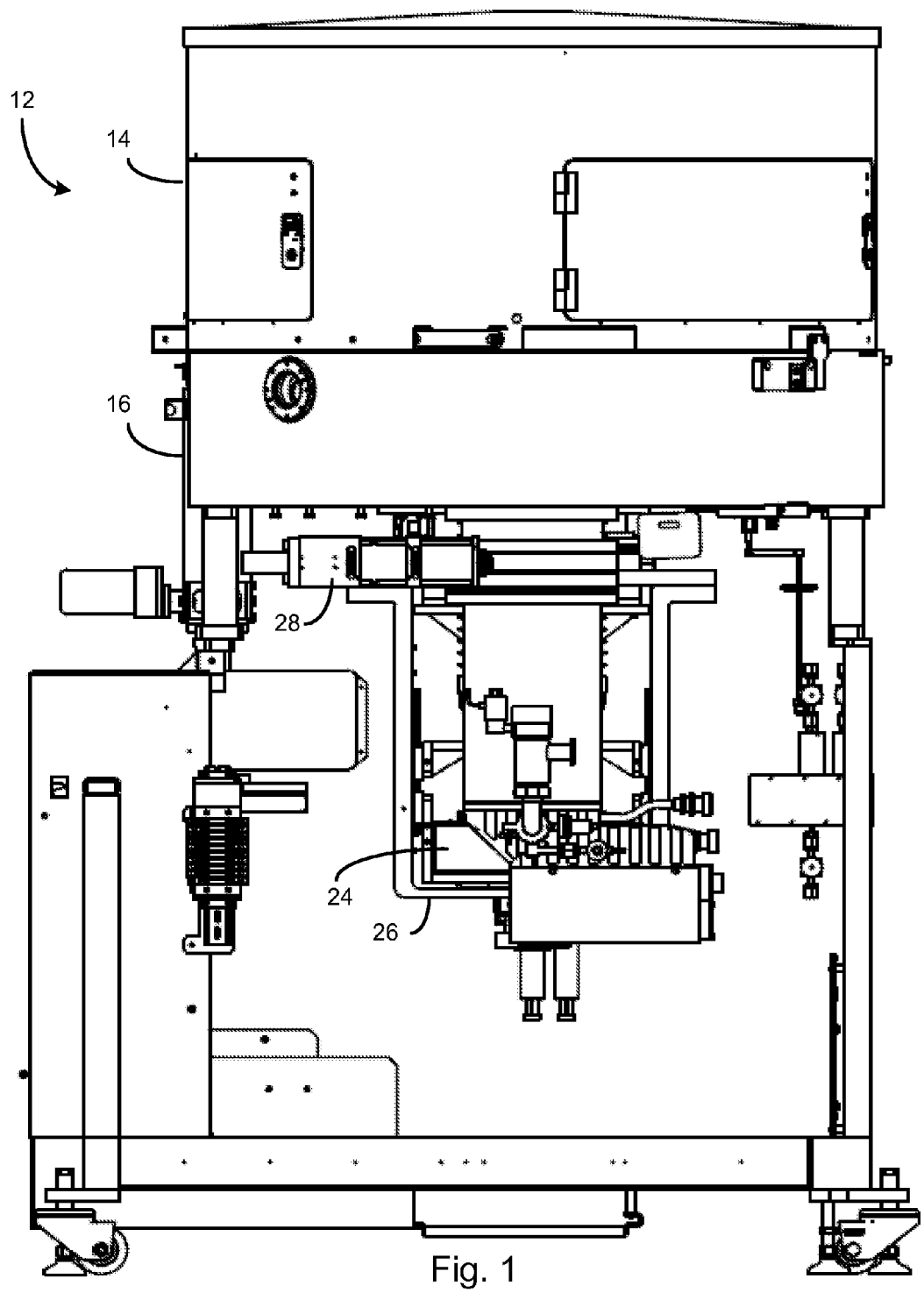
FIG. 1 is a side view of the sputtering system in accordance with one embodiment of the invention.
Figure 2:
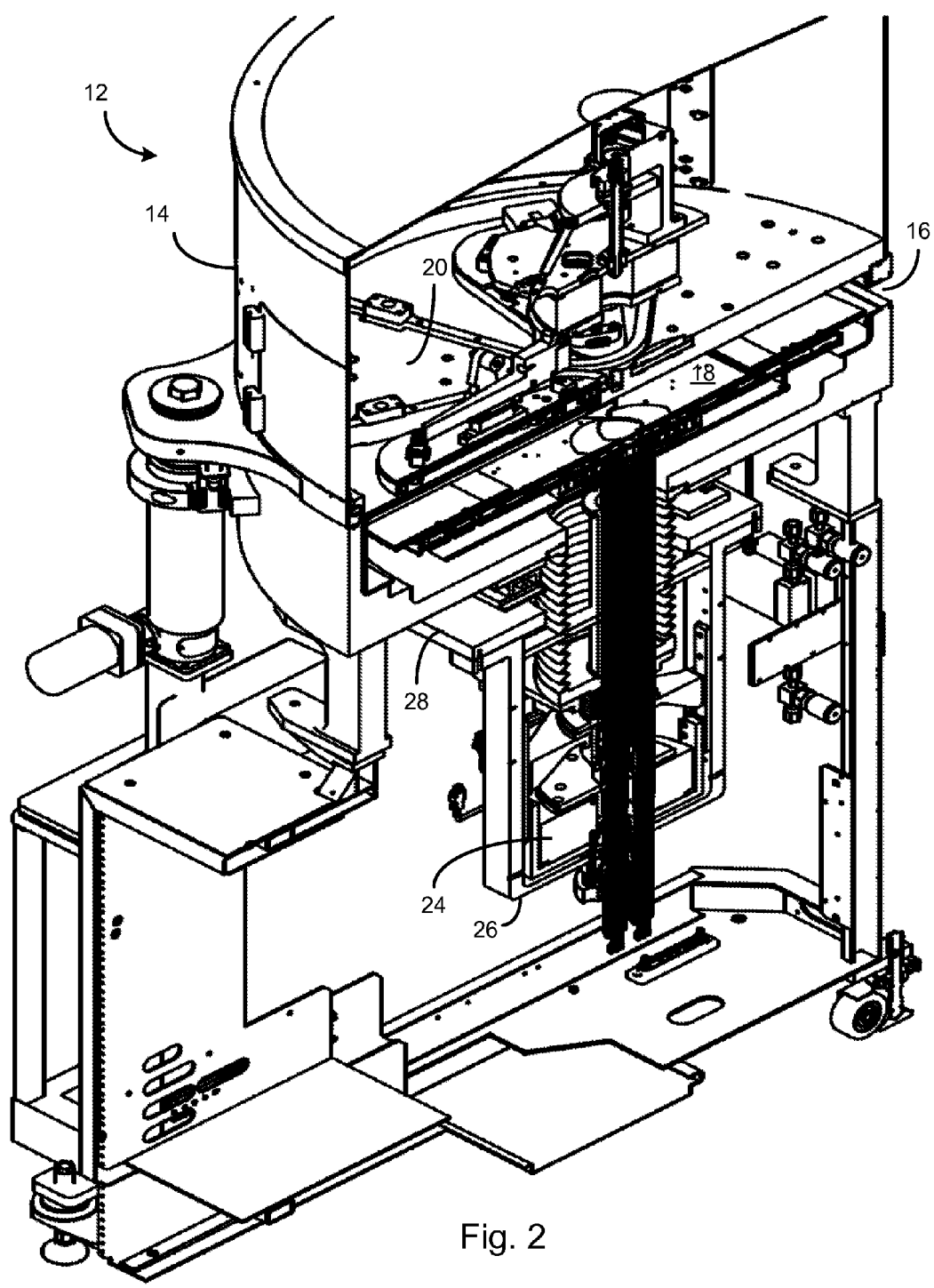
FIG. 2 is a bisected perspective view of the system of FIG. 1.
Figure 3:
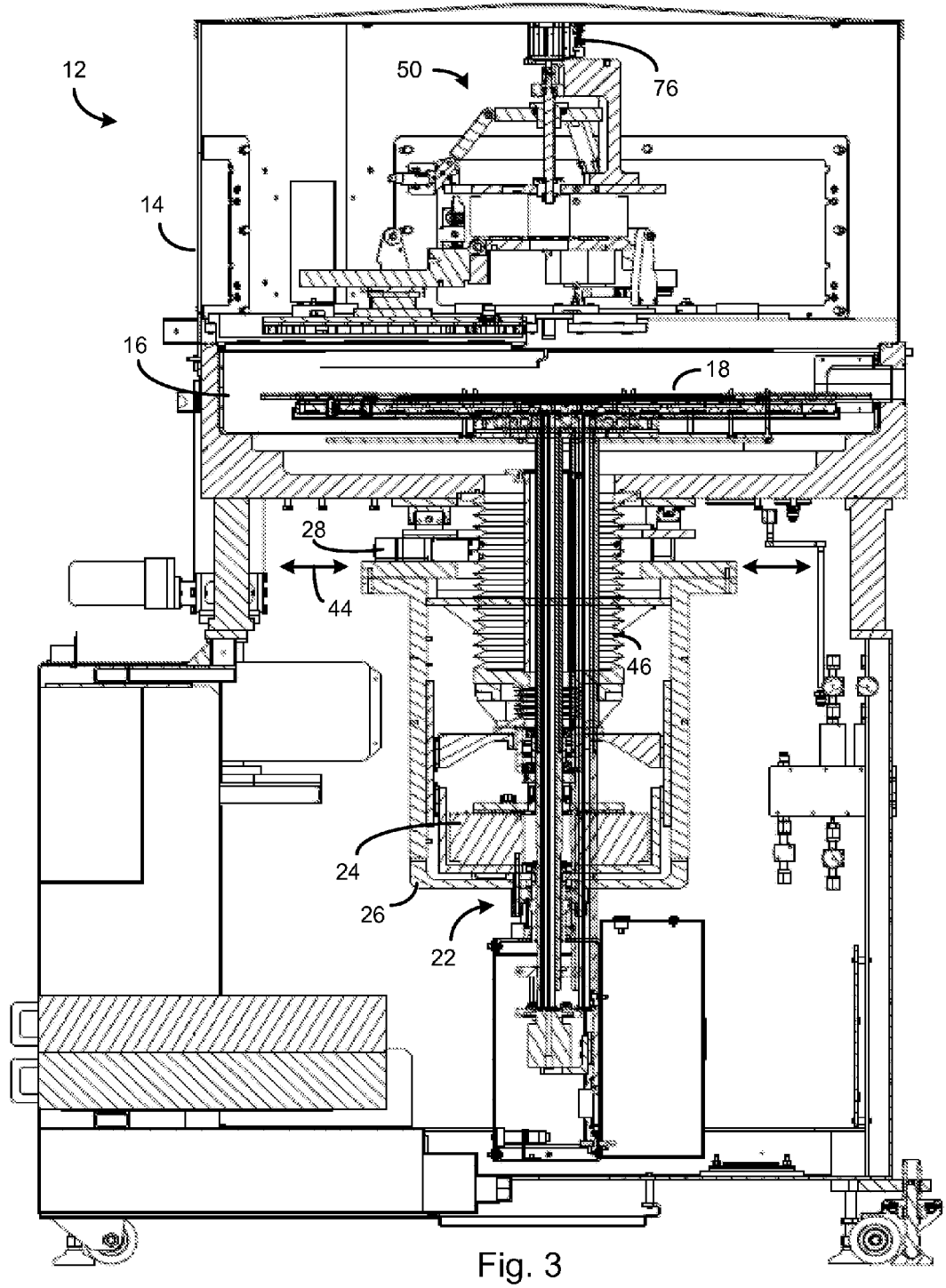
FIG. 3 is a bisected side view of the system of FIG. 1.

FIGS. 1-3 illustrate the inventive sputtering system 12 in accordance with one embodiment of the invention. The sputtering system 12 may be used for workpieces such as semiconductor wafers, display panels, mechanical parts, and other workpieces requiring the deposition of thin films. Examples of thin films include Al, Cu, Ta, Au, Ti, Ag, Sn, NiV, Cr, TaNx, Hf, Zr, W, TiW, TiNx, AlNx, AlOx, HfOx, ZrOx, TiOx, magnetic films, and various alloys of these materials.

In FIG. 1, the top cover 14 covers the magnetron and other components above the vacuum chamber 16. A rotating pallet and various targets reside within the vacuum chamber 16.

In one embodiment, the system 12 can process any size workpiece that can fit on the rotating pallet 18 (FIGS. 2 and 3), such as a large display panel. Alternatively, the system 12 can simultaneously process multiple standard semiconductor wafers (e.g., five or more) using multiple sputtering targets (e.g., 3-6).

The pallet 18 rotates to move a workpiece directly below an appropriate wedge-shaped target. Each target may be a different material for forming successive thin films of different materials on a workpiece, or the targets may be the same material. The targets are directly below an associated target backing plate 20 (FIG. 2).

The pallet 18 has a central shaft 22 (FIG. 3) that is rotated by a motor 24, such as a stepper motor or a servo motor. The pallet 18 may be formed of aluminum. The pallet 18 may be continuously rotated at any speed or may be temporarily stopped to control the deposition of a sputtered material from a target overlying a workpiece.

Figure 4:
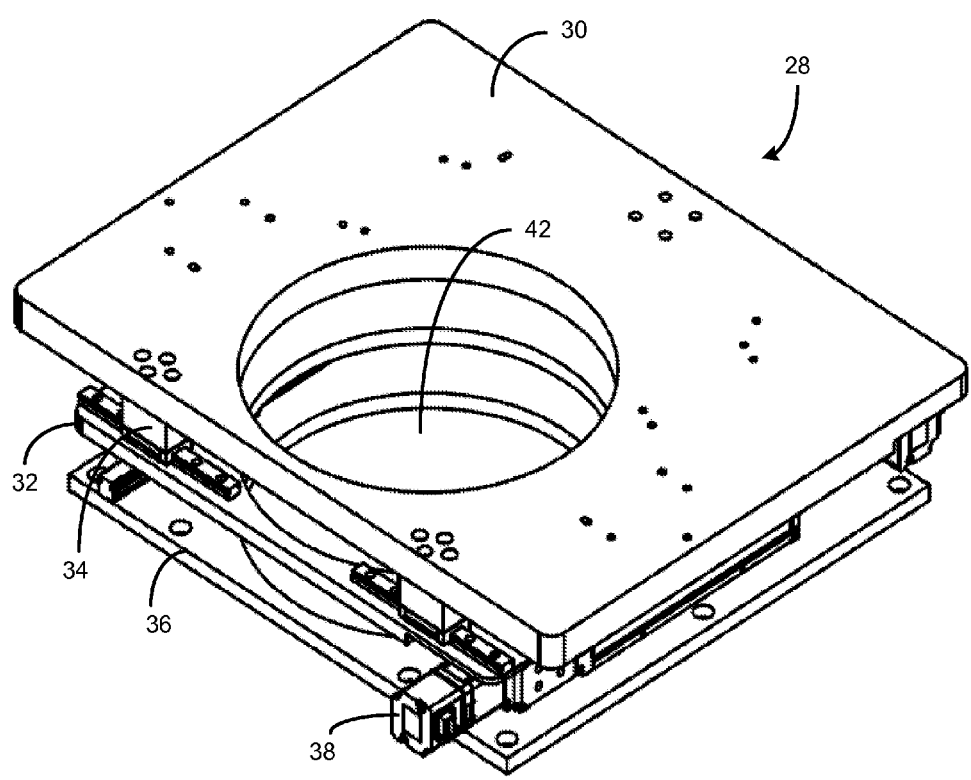
FIG. 4 is a perspective view of an XY stage which moves the rotating pallet in a controlled XY direction.

The servo or stepper motor 24 is mounted on a mounting area 26 of an XY stage 28. FIG. 4 illustrates the XY stage 28 in greater detail. The XY stage 28 has a stationary top plate 30 mounted to the bottom surface of the vacuum chamber 16. A middle plate 32 moves in an X direction relative to the top plate 30 using an X linear motor 34. The linear motor includes a small rotating motor with a cam that engages a long screw so that the screw is moved in a linear direction with respect to the motor. The motor may be attached to the top plate 30, and the screw is rotatably mounted on the middle plate 32. Tracks keep the middle plate 32 slidably attached to the top plate 30. Similarly, the bottom plate 36 is slidably attached to the middle plate 32 using tracks and a Y linear motor 38 that is identical to the X linear motor 34.

A large center opening 42 in the XY stage 28 accommodates the pallet shaft 22 and allows some XY movement of the shaft 22 within the opening 42. As shown by the arrows 44 in FIG. 3, the XY stage 28 can move the rotatable pallet 18 within the vacuum chamber 16 in an XY plane. The amount of movement can be any amount, depending on the size of the system. In one embodiment, the movement may be greater than 4 inches.

A bellows 46 (FIG. 3) extends through the hole 42 in the XY stage 28 and surrounds the shaft 22 to maintain a vacuum seal around the shaft 22.

The magnetron assembly 50 in the top (non-vacuum) compartment of the system 12 moves a magnet around each of the target backing plates 20. The magnets attract the ions in the sputtering gas to the targets to accelerate and direct the ions. The ions then knock out atoms of the target for sputtering the target material on the workpiece substantially directly below the magnet. The aluminum pallet 18 has a potential that attracts the sputtered material to the workpiece. More detail regarding the magnetron assembly 50 is presented later.

Figure 5:
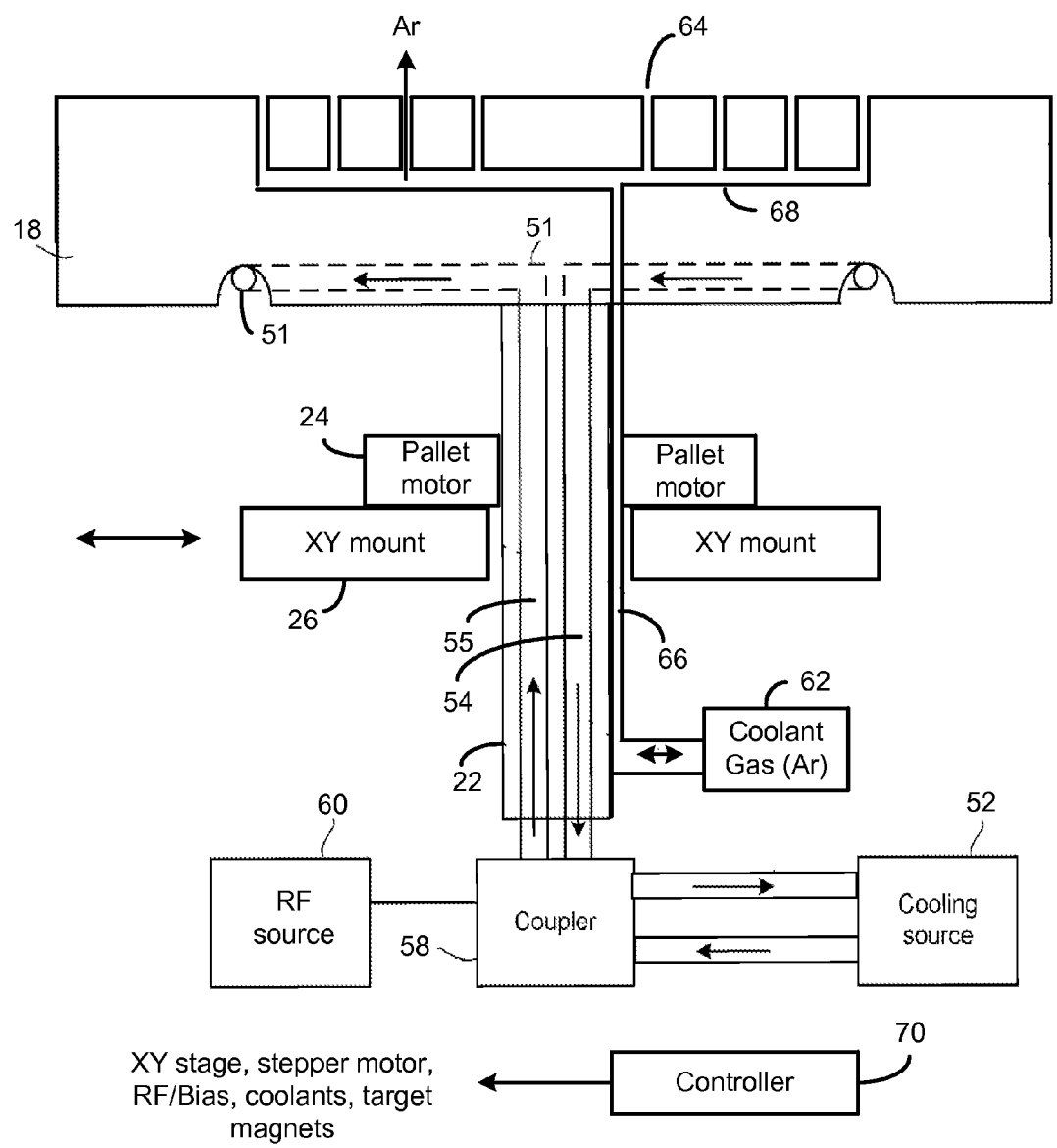
FIG. 5 is a schematic cross-sectional view of the pallet, showing the liquid coolant channel, the backside coolant gas channel, the pallet motor, the XY mount for the motor and pallet, the RF/biasing source, and the programmed controller (a processor).

FIG. 5 is a schematic cross-sectional view of an area of the pallet 18, with various features exaggerated for ease of illustration. The pallet motor 24 is shown rotating the shaft 22, and the motor 24 is mounted on the XY stage mounting area 26.

The pallet 18 has liquid channels or tubing 51 that receive a liquid coolant from a recirculating cooling source 52. The coolant flows through input and output lines 54/55 in the shaft 22 and within the pallet 18. A coupler 58 provides a rotating seal for the input/output lines 54/55.

The coupler 58 is shown also coupling an optional RF source 60 to the aluminum pallet 18 for generating a plasma and for attracting ions to the workpiece.

In addition to cooling the pallet 18, a backside coolant gas source 62 is also provided to supply a backside gas, such as argon or other inert gas, through openings 64 in the pallet 18. A gas channel 66 in the shaft 22 supplies the gas to a diffuser 68 in the pallet 18 for distributing the gas to the openings 64. The coupler 58 may also provide a gas seal to allow the shaft 22 to rotate while the backside gas is being supplied. A gas exit channel for maintaining a desired gas pressure is outside of the cross-section. Optionally, the gas may also exit into the chamber without a return path. The use of the backside gas to cool a workpiece is discussed later. The backside gas feature is not always used.

A controller 70 comprises a programmed processing system and automatically controls the XY stage 28, motor 24, RF source 60, coolants, and target magnets pursuant to a pre-programmed routine to deposit one or more sputtered layers on the workpiece.

The RF source 60 (FIG. 5) is electrically coupled to the aluminum pallet 18 by the rotatable coupling 58 to create a plasma. In another embodiment, the pallet 18 is grounded, floated, or biased with only a DC voltage source.

When the chamber 16 is evacuated and filled with a certain amount of Ar gas at a certain pressure (for example, 20 milli-torr) and the gas is energized with a DC source, an RF source, or a combination of the two sources, an electromagnetic field is coupled inside the chamber to excite a sustained high density plasma near the target surface. The plasma confined near the target surface contains positive ions (such as Ar+) and free electrons. The ions in the plasma strike the target surface and sputter material off the target. The workpieces receive the sputtered material to form a deposited layer on the surface of the workpieces. In one instance, up to twenty kilowatts of DC power can be provided on each target. In such a case, each target can deposit approximately 1 micron of metal per minute on an underlying work piece. A typical RPM of the pallet 18 during the deposition process is 5-30 RPM. The pallet 18 may be rotating during deposition or stopped.

The chamber wall is typically electrically grounded during sputtering operations.

A bias voltage on the workpieces can drive a flux of an electrically charged species (Ar+ and/or atomic vapor sputtered off the target) to the workpieces. The flux can modify the properties (for example, density) of the sputtered material to the wafers.

Generating a plasma for sputtering and the various biasing schemes are well known, and any of the known techniques may be implemented with the described sputtering system.

Figure 6:
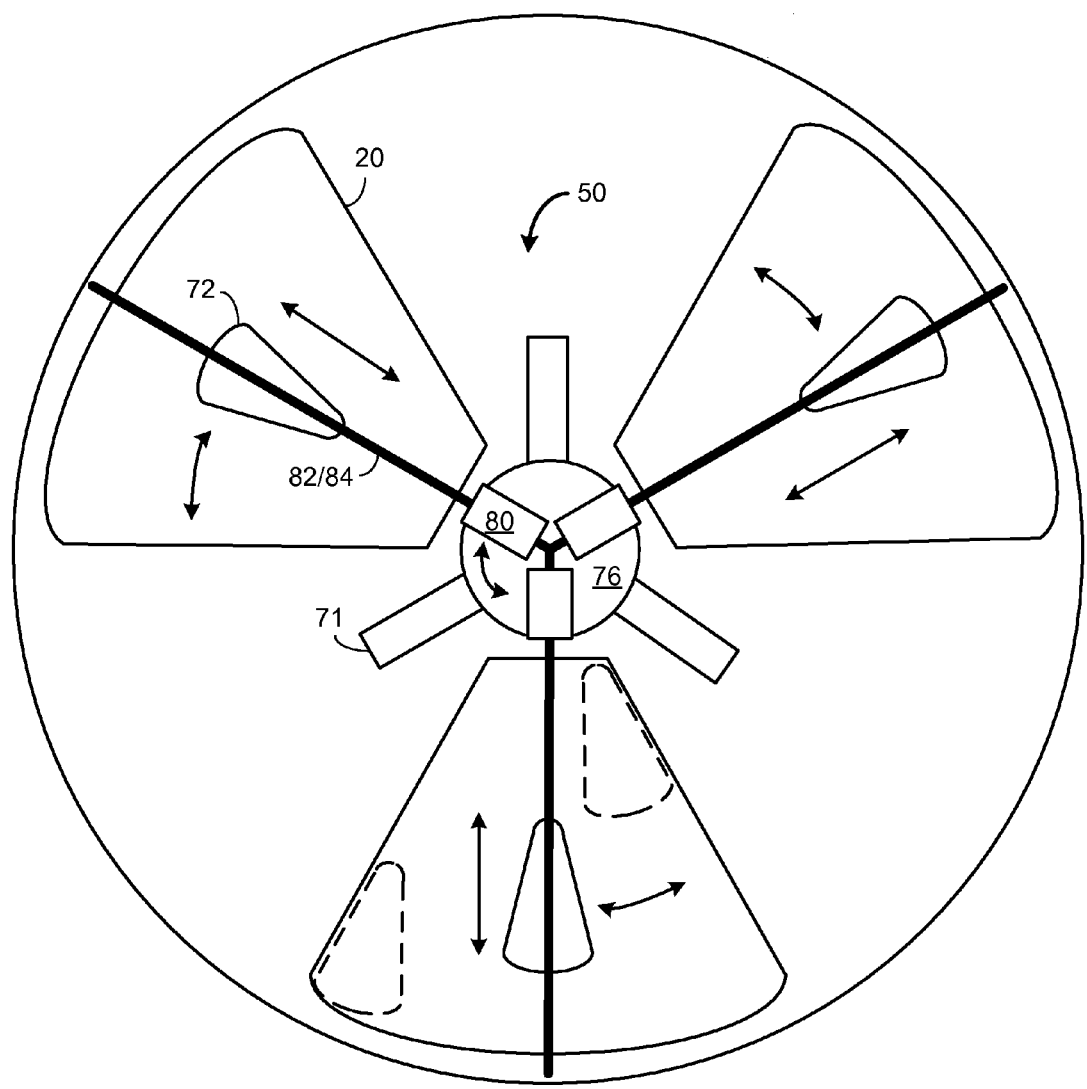
FIG. 6 is a top down view of the magnetron over the wedge-shaped targets above the vacuum chamber.

FIG. 6 is a top down schematic illustration of the target backing plates 20 and the magnetron assembly 50. Targets are mounted to the top ceiling of the vacuum chamber directly under the target backing plates 20. The targets have the same outline as the plates 20. A contamination shield 71 (a vertical wall) extends any length between targets for preventing cross-contamination. Some possible positions for the magnet 72 during motion are shown in dashed outline.

Figure 7:
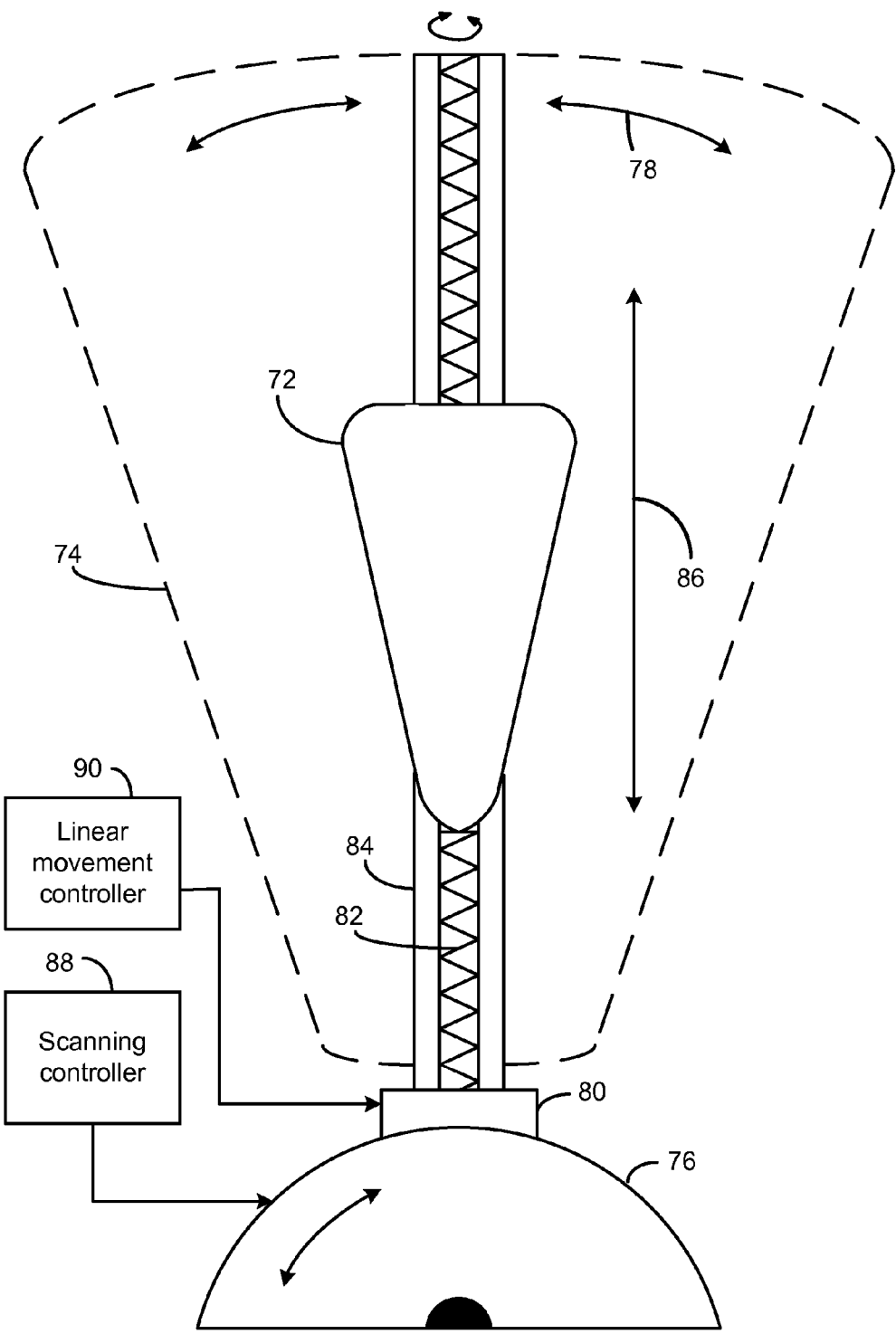
FIG. 7 illustrates how the magnet over the target moves linearly as well as in an arcing motion to cover all areas of the target and to prevent sputtering over areas where no workpiece is directly underneath the target.

FIG. 7 illustrates a single scanning magnet 72 over a target 74. The view is looking up from the target 74 though the target backing plate. In one embodiment, the delta-shaped magnet 72 is about 10.7 inches (27 cm) long and about 3 inches (7.6 cm) wide at its widest part. A motor 76 (also shown in FIG. 3) moves all magnets 72 back and forth in an arc path 78 over the target backing plate 20 and target 74. The motor 76 may be any type of scanning actuator, such as a servo/stepper. The rate of scan can be any rate. The motor 76 scans the magnet 72 to the left and right edges of the target for each scan of the magnet 72. When the magnet 72 is over a portion of the target 74, that portion will be primarily bombarded by ions in the plasma and deposit sputtered material on the underlying workpiece. The magnet 72 is also moved linearly along any portion of the length of the target 74 by a linear motor. The linear motor includes a motor 80 that rotates a screw 82 within a track 84. The back of the magnet 72 has a threaded coupling (like a nut) that is moved linearly by the rotating screw 82 in the direction of the arrow 86. The linear motor can be any type of linear actuator.

A scanning controller 88 controls the simultaneous arcing scan of the magnets 72, and a linear movement controller 90 independently, and individually, controls the linear movement of an associated magnet 72. Each magnet, associated with a different target, may be controlled differently, depending on the requirements of the sputtering for that target. The controllers 88 and 90 may be part of the controller 70 of FIG. 5.

More specifically, the function of the magnet 72 is as follows. The magnet 72 confines the plasma to the target area. The resulting magnetic field forms a closed-loop annular path acting as an electron trap that reshapes the trajectories of the secondary electrons ejected from target into a cycloidal path, greatly increasing the probability of ionization of the sputtering gas within the confinement zone. Inert gases, specifically argon, are usually employed as the sputtering gas because they tend not to react with the target material or combine with any process gases and because they produce higher sputtering and deposition rates due to their high molecular weight. Positively charged argon ions from the plasma are accelerated toward the negatively biased target and impact the target, resulting in material being sputtered from the target surface.

The scanning controller 88 oscillates all the magnets 72 back and forth in unison over their associated targets at an oscillating period of between 0.5-10 seconds. The magnets 72 are oscillated so that the magnetic fields are not always at the same position relative to the target. By distributing the magnetic fields evenly over the target, target erosion is uniform.

Figure 8:
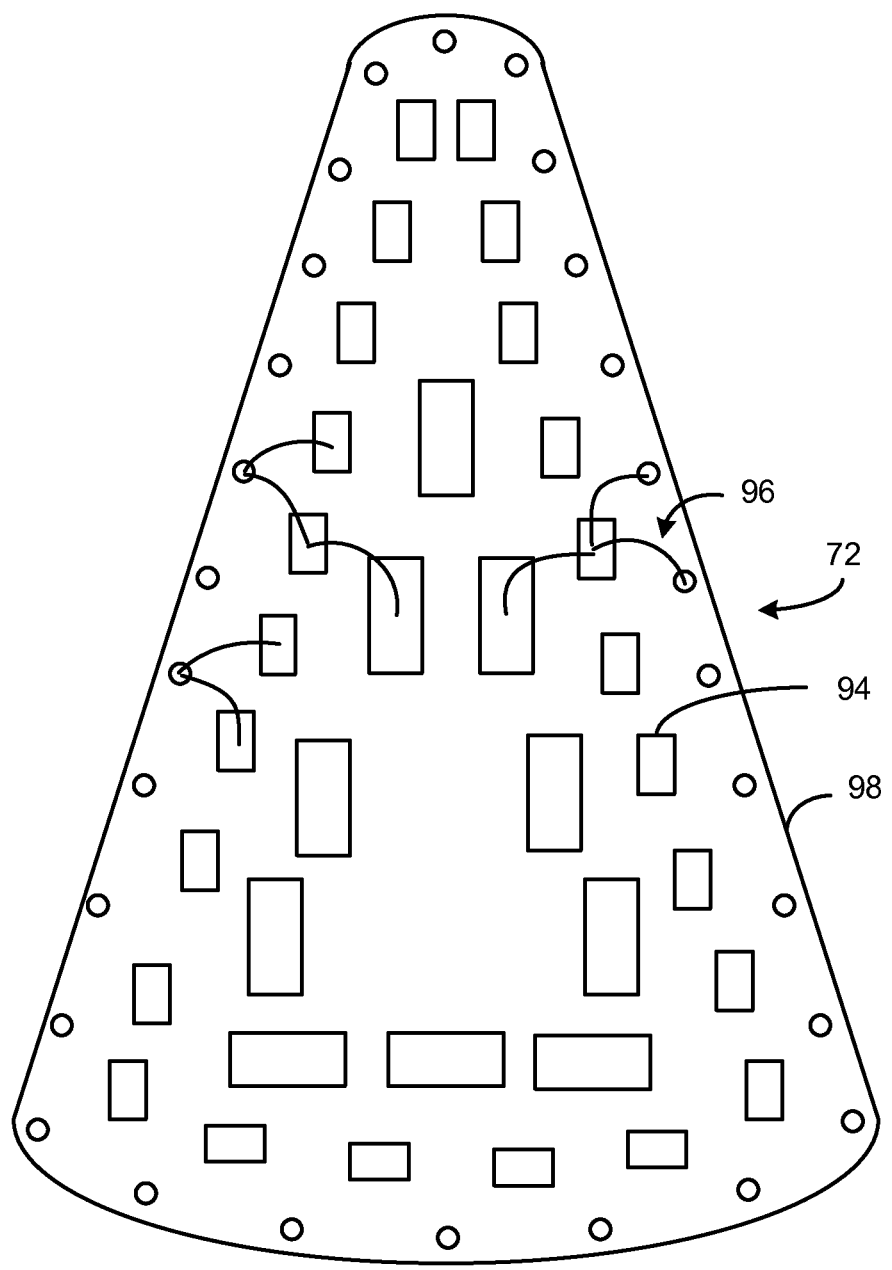
FIG. 8 illustrates how the magnet is composed of many smaller magnets to create a substantially uniform magnetic field behind the target.

FIG. 8 illustrates the magnet 72 in more detail. The magnet 72 has a triangular or delta shape with rounded corners. In one embodiment, the thickness of magnet 72 is between 0.5-1¼ inch thick (12-31 mm). In the example of FIG. 8, there are three rings (nested patterns) of individual magnets 94, where adjacent rings have opposite poles so that a magnetic field spans across one ring to the next. Some magnetic field lines 96 are shown. Since there are three rings of magnets, there are two racetracks of field lines. These magnetic fields pass through the target backing plate 20 (FIG. 6) and intersect the target attached to the underside of the target backing plate 20. The plasma density at the target (and thus the erosion rate) is greatest at the highest magnetic field intensity. The sizes, shapes, and distribution of the individual magnets 94 are selected to create a uniform erosion of the target. The magnets 94 are mounted to a magnetic backing plate 98, also known as a shunt plate, which may be formed of a ferrous material. The shape and magnetic properties of the shunt plate 98 may be altered to optimize the performance of the magnet 72. The magnet 72 may instead be an electromagnet.

Figure 9:
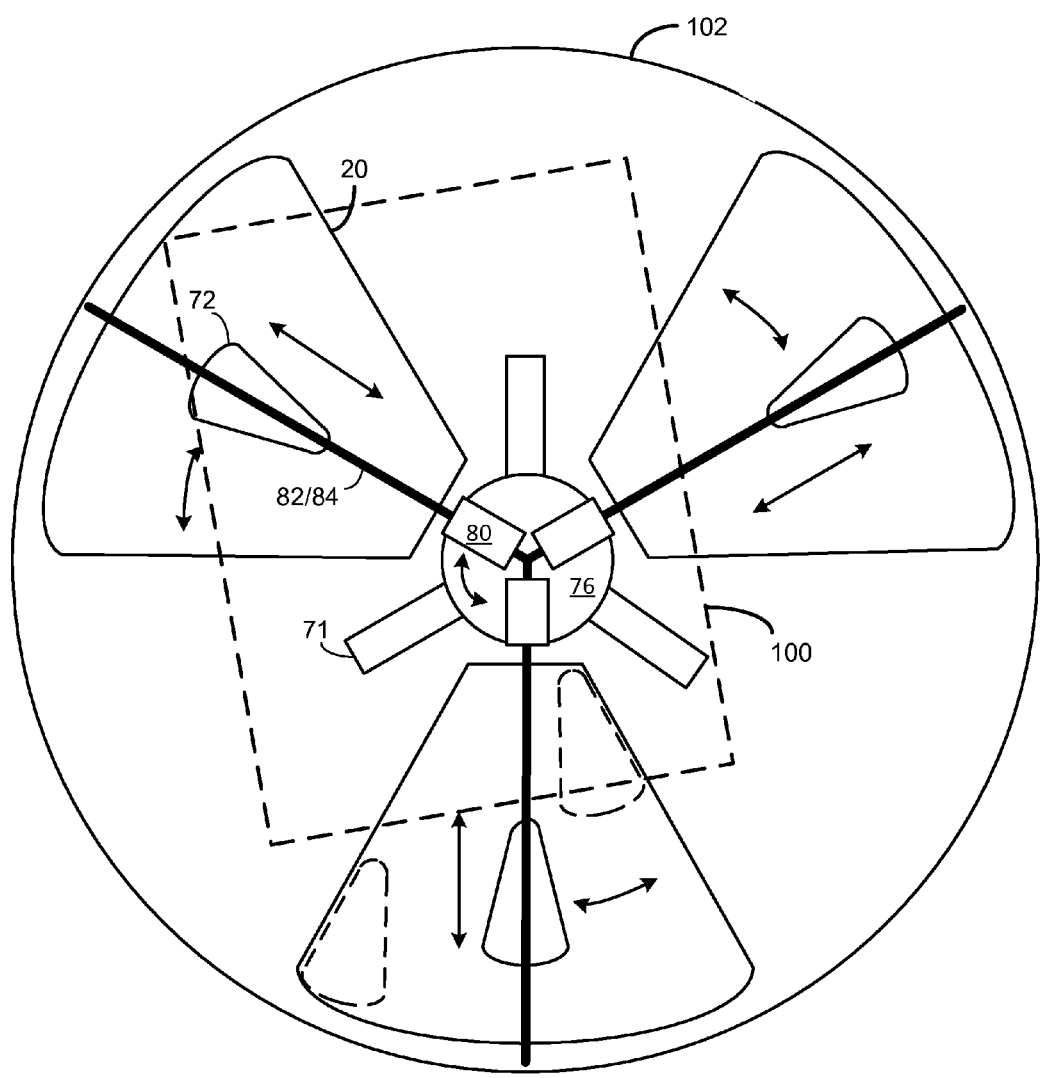
FIG. 9 illustrates how a large rectangular panel (a workpiece on the pallet in the vacuum chamber) is rotated by the pallet and shifted in an XY plane below the targets and how the magnets for the targets can be controlled to only pass over portions of the target directly above the panel.

FIG. 9 is identical to FIG. 6 except that the outline of a relative large panel 100 (a workpiece) is shown mounted on the rotating pallet.

Figure 10:
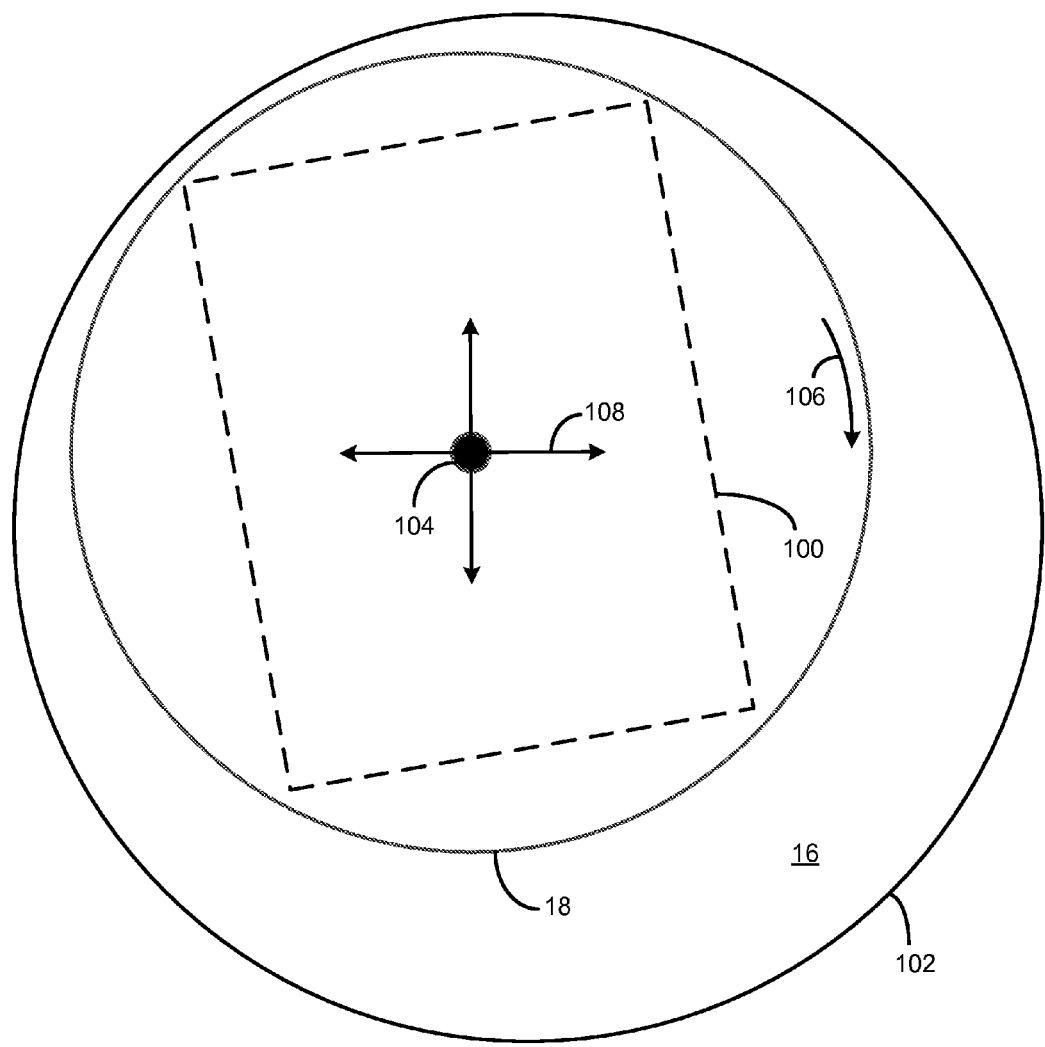
FIG. 10 illustrates how the rectangular panel is rotated and shifted in an XY plane within the vacuum chamber to obtain full sputtering coverage of the panel.

FIG. 10 shows the panel 100 mounted on the pallet 18. The inside wall 102 of the vacuum chamber 16 is also shown. Note that the diameter of the pallet 18 is significantly smaller than the diameter of the chamber 16 to allow the pallet 18 to be moved in an XY plane within the chamber 16.

In the prior art sputtering chambers having a rotating pallet, if a large workpiece, such as the panel 100, were mounted on the pallet, the middle area of the workpiece could not be positioned under a target, since the targets do not extend over the center of the chamber. However, in the present invention, the center 104 of the pallet 18 is movable so as to be under any of the targets by shifting the XY stage 28 (FIGS. 3 and 4). Therefore, by controlling the rotation of the pallet 18 in conjunction with the XY stage 28, all portions of the panel 100 may be positioned under any target for receiving a sputtered layer of the target material. The arrows 106 and 108 illustrate the rotation of the pallet 18 and the XY movement of the pallet 18. In one embodiment, the diameter of the pallet 18 is at least 4 inches less than the diameter of the chamber 16 to allow the center of the pallet 18 to be shifted up to plus/minus 2 inches in order to position the panel 100 under a target.

Referring back to FIG. 9, it can be seen that the corners of the rectangular panel 100 extend closer to the wall 102 of the chamber 16 than the flat sides of the panel 100. When the corner of the panel 100 is below the outer end of the target (having the same outline as the target backing plate 20), the magnet 72 needs to be positioned, via the scanning and linear motors 76/80, above the outer end of the target to promote sputtering onto the corner area of the panel 100. However, when the side of the panel 100 is below a target, the side may only be below the inner one-third or less of the target. Thus, sputtering from the outer end of the target will waste target material (and generate debris) when no portion of the panel 100 is below the outer edge. Therefore, in accordance with one embodiment of the invention, the linear movement controller 90 (FIG. 3) is programmed to control the magnet 72 movement so that the magnet 72 is substantially moved only over portions of the panel 100 (or other workpiece). The dimensions of the panel 100 are programmed into the controller 70 (FIG. 5) or 90 (FIG. 7) and the position of the panel 100 at any time is determined by the position of the pallet 18.

In one application, the magnet 72 is continuously scanned in an arc via the motor 76 and controller 88 (FIG. 7) during the entire sputtering process. In another application, the controllers 88/90 of FIG. 7 are programmed to control the magnet 72 to stop scanning or slow scanning, via the combination of the scanning/linear motors 76/80, in order to minimize the waste of target material by reducing/preventing sputtering when there is no workpiece under areas of the target.

If all the targets are the same material and the pallet is rotating the rectangular panel 109 under the targets, the scanning/linear motors for one magnet will control their associated magnet in one way to ensure the magnet is only over a portion of the panel 100 and the scanning/linear motors for another magnet may control their associate magnet in a different way to ensure all magnets are only above a portion of the panel 100 so no sputtering material is wasted.

Although the panel 100 in FIG. 9 is shown having a diagonal dimension approximately equal to the diameter of the pallet 18, the panel 100 can be any size. If the workpiece is small, such as a silicon wafer, the wafers may be positioned around the periphery of the pallet 18 so XY shifting of the pallet 18 is not needed to position the wafers directly under each target.

The XY shifting of the pallet 18 and the control of the magnets 72 to limit the waste of target material are also applicable where multiple wafers are distributed over the pallet 18, where there are spaces between the wafers, and where the wafers cover the center area of the pallet 18. The positioning of the magnets 72 and the shifting of the pallet 18 are controlled to substantially limit sputtering material to only the wafer surfaces and not the pallet 18 surface.

Figure 12:
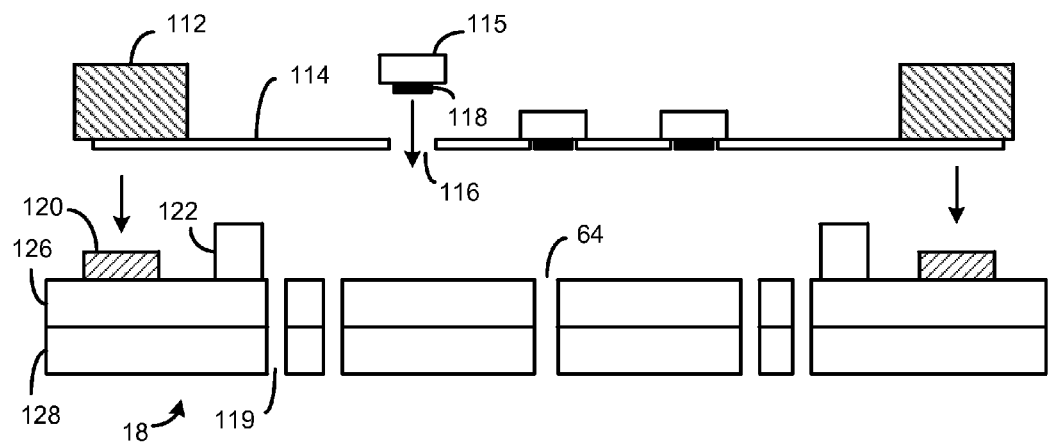
FIG. 12 is a schematic cross-section of one of the steel rings being mounted over the pallet, showing a backside cooling gas channel in the pallet, a circular ridge, and magnets on the pallet.
Figure 13:
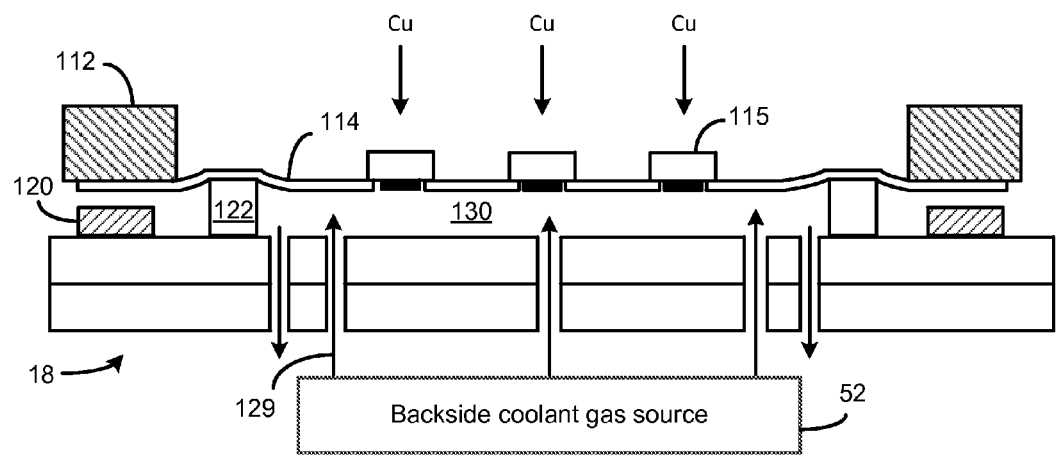
FIG. 13 illustrates how the magnets on the pallet pull down the steel ring to create a backside gas seal around the periphery of the sticky tape for cooling the packages with a backside gas.

Another use of the sputtering system 12 is to sputter a copper film or other metal film over a batch of packaged integrated circuit chips, or over some other structures, to act as a shield to mitigate electromagnetic interference (EMI). Such packaged ICs would not have good thermal contact to the pallet 18 so could not be cooled by cooling the pallet 18 (using the liquid coolant). One technique to support an array of packaged ICs is shown in FIGS. 11-13.

Figure 11:
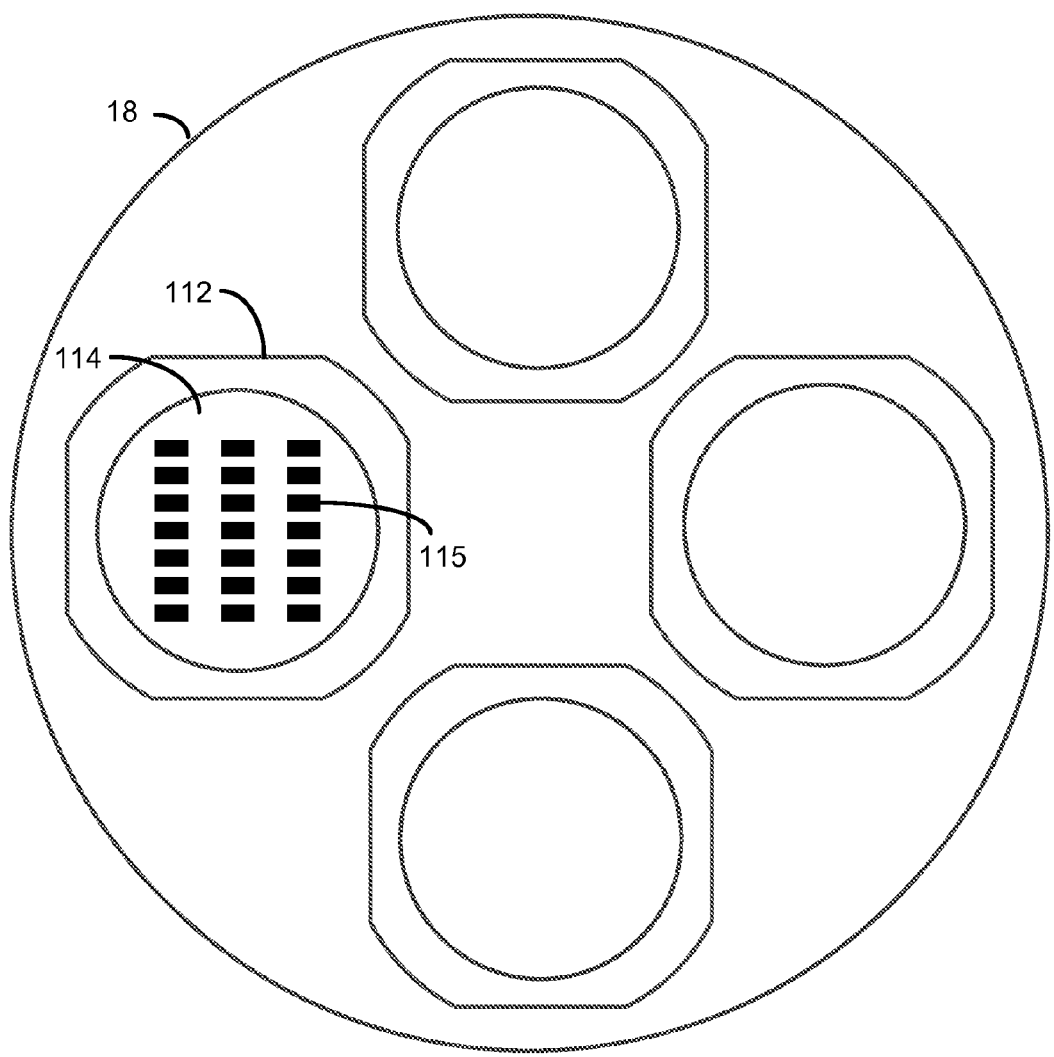
FIG. 11 illustrates the pallet on which is mounted four steel rings supporting a sticky tape, with packaged integrated circuit chips mounted on the tape for receiving a sputtered metal shielding layer.

In FIG. 11, steel rings 112, or other rings formed of a high magnetic permeability material, have a sticky tape 114 secured to their underside so the tape 114 is taut across the opening of the rings 112. The rings 112, acting as frames, may be other shapes, such as rectangular. The tape 114 has rectangular openings 116 (FIG. 12) that are customized for the particular packages 115 being shielded. The openings 116 are just large enough for the bottom land grid array (LGA) or ball grid array (BGA) electrodes 118 to be within the openings, and the outer edges of the package create a seal with the top surface of the sticky tape 114, as shown in FIG. 12. It is not desirable to directly adhere the electrodes 118 to the sticky tape for at least the reasons that the sputtered material for the shielding layer may short out the electrodes and that the metal electrodes may be pulled off the packages when they are removed from the tape 114.

In the example shown, there are four identical arrays of packages 115 mounted on the pallet 18 for receiving a metal shielding layer.

In one example, if the packages 115 were not cooled somehow during the sputtering process, the temperature of the packages 115 would reach 220° C., and the packages 115 are only rated to withstand 150° C. Therefore, so means of cooling the packages 115 is required.

Applicant's system cools the packages 115 with a recirculating backside gas, such as argon or other inert gas. As shown in FIG. 5, the shaft 22 of the pallet 18 has a channel 66 for a coolant gas, and the pallet 18 has a manifold 68 and openings 64 for the gas to exit the surface of the pallet 18. As shown in FIG. 12, the pallet 18 also includes openings 119 for a return path of the gas for cooling the gas. The gas exit channel is also along the pallet shaft.

In FIG. 12, the pallet 18 surface includes magnets 120 and a circular ridge 122, assuming the opening of the rings 112 is circular. Other shapes are envisioned.

As shown in FIG. 13, the magnets 120 pull the steel ring 112 downward so that the ridge 122 creates a gas seal with respect to the underside (non-sticky side) of the tape 114 and creates an open backside gas volume. The magnets 120 do not need to contact the entire periphery of the ring 112. The magnets 120 may be permanent magnets or electromagnets.

In one embodiment, the pallet 18 has many functions, and a special surface plate 126 (FIG. 12), having the magnets 120 and ridges 122, is affixed to the top of a flat pallet plate 128, such as with screws. For other uses, a different surface plate may be affixed to the flat pallet plate 128 such as for sputtering on the panel 100 in FIG. 10 or on multiple wafers.

During sputtering of Cu to deposit a shielding layer over the packages 115, the backside gas 129 is recirculated, by the backside coolant gas source 52, within the backside gas volume 130 behind the packages 115 to a predetermined pressure. The heat is removed from the packages 115 and the tape 114 by the recirculating backside gas 129. The temperature of the packages 115 is highly controllable by controlling the flow of the backside gas. Return paths 119 for the gas 129 may be included around the periphery of the backside gas volume 130.

Other workpieces besides packages may be cooled using the basic technique of FIGS. 11-13. High heat dissipation during sputtering is essential for devices such as microprocessors, analog chips, etc. These wafers may be very thin (e.g., 30-200 microns) as a result of a back-grinding process, where the front surface of the wafer is mounted on a sticky tape during the grinding process. The tape 114 is then mounted to the rings 112, and a backside metal (e.g., Ti/Ni/Au) is sputtered over the back surface of the wafers. The wafers are cooled by the backside gas. The wafers may then be singulated while still attached to the sticky tape 114. The invention applies to any workpiece that may not be in good thermal contact with the pallet 18 or needs extra cooling.

The invention pertaining to FIGS. 11-13 is independent of the rotating pallet 18 and the other aspects of the PVD system described with respect to FIGS. 1-10. The support surface for the steel rings 112 may be stationary. The sticky tape 114 can be used in other ways, such as supporting workpieces without openings in the tape 114. The invention will cool the backside of the tape and any workpieces in thermal contact with the tape 114. In one embodiment, the ring 112 material itself may not have a high magnetic permeability, such as the ring 112 being a dielectric, but the ring 112 has areas of high magnetic permeability, such as thin steel plates adhesively affixed to the bottom of the ring 112.

Conventional aspects of the system that have not been described in detail would be well known to those skilled in the art. U.S. Pat. No. 6,630,201 and U.S. Patent Application Publication 2002/0160125 A1 are incorporated herein by reference for certain conventional aspects primarily related to creating a plasma and supplying gas to a process chamber.

Although the system has been described with respect to examples of forming a metal film on workpieces, the system may deposit any material, including dielectrics, and may process any workpiece. In one embodiment, the system is used to deposit materials on multiple thin film transistor arrays for LCD panels. The invention is not limited to the specific examples described herein.

Having described the invention in detail, those skilled in the art will appreciate that, given the present disclosure, modifications may be made to the invention without departing from the spirit and inventive concepts described herein. Therefore, it is not intended that the scope of the invention be limited to the specific embodiments illustrated and described.

What is claimed is:

1. A physical vapor deposition device comprising:
   a chamber having inner walls, the chamber being configured to create a low pressure environment in the chamber while sputtering materials on a workpiece;
   a target positioned within the chamber, a front side of the target being directed into the chamber for sputtering material from the target onto the workpiece;
   a workpiece support platform, the platform having openings for a backside gas;
   a ring providing a frame for a sticky tape, the sticky tape supporting the workpiece;
   one or more magnets on the support platform for attracting the ring to the one or more magnets;
   a ridge on the support platform in contact with an underside of the sticky tape creating a gas seal with respect to the sticky tape as the ring is attracted to the one or more magnets on the support platform, so that an area between the tape and the support platform forms a sealed backside gas volume; and
   a backside gas channel for introducing a backside gas into the backside gas volume for cooling the workpiece supported by the tape.

2. The device of claim 1 wherein the sticky tape has at least one opening that exposes a back surface of the workpiece to the backside gas volume.

3. The device of claim 1 wherein the workpiece is one of a plurality of workpieces supported on a top surface of the sticky tape.

4. The device of claim 1 wherein the one or more magnets are permanent magnets.

5. The device of claim 1 wherein the ring is formed of a high magnetic permeability material.

6. The device of claim 5 wherein the ring is formed of steel.

7. The device of claim 1 wherein the target deposits a metal shield over the workpiece.

8. The device of claim 1 wherein the target deposits a backside metal over the workpiece.

9. The device of claim 1 wherein there is a plurality of rings providing frames for sticky tape within the chamber for batch processing of workpieces.

* * * * *